(12) United States Patent
George et al.

(10) Patent No.: US 9,407,048 B2
(45) Date of Patent: Aug. 2, 2016

(54) PROTECTIVE CASE FOR PORTABLE ELECTRONIC DEVICE WITH INTEGRATED DISPENSABLE AND RETRACTABLE CHARGE AND SYNC CABLE

(71) Applicant: CordCase LLC, Wilmington, DE (US)

(72) Inventors: Joseph James George, Amherst, NH (US); Ryan Fletcher Shepard, Colchester, VT (US)

(73) Assignee: CordCase LLC, Wilmington, DE (US)

( * ) Notice: Subject to any disclaimer, the term of this patent is extended or adjusted under 35 U.S.C. 154(b) by 101 days.

(21) Appl. No.: 14/453,818

(22) Filed: Aug. 7, 2014

(65) Prior Publication Data
US 2016/0043514 A1 Feb. 11, 2016

(51) Int. Cl.
| | |
|---|---|
| H01R 13/72 | (2006.01) |
| H01R 13/66 | (2006.01) |
| H01R 13/52 | (2006.01) |
| H04B 1/40 | (2015.01) |
| H02G 11/02 | (2006.01) |
| H04R 1/10 | (2006.01) |
| H04B 1/3888 | (2015.01) |
| H04M 1/15 | (2006.01) |
| H04M 1/18 | (2006.01) |

(52) U.S. Cl.
CPC ............. *H01R 13/72* (2013.01); *H01R 13/52* (2013.01); *H01R 13/665* (2013.01); *H02G 11/02* (2013.01); *H04B 1/3888* (2013.01); *H04B 1/40* (2013.01); *H04M 1/15* (2013.01); *H04M 1/185* (2013.01); *H04R 1/1033* (2013.01)

(58) Field of Classification Search
CPC ...... H01R 13/72; H01R 13/52; H01R 13/665; H01R 1/1033; H02J 7/0042; H04B 1/40; H04B 1/3888; H02G 11/02; H04M 1/15; H04M 1/185
See application file for complete search history.

(56) References Cited

U.S. PATENT DOCUMENTS

| | | |
|---|---|---|
| 1,116,402 A | 11/1914 | Ferguson |
| 5,128,993 A | 7/1992 | Skowronski |
| 5,236,371 A | 8/1993 | Matthis |
| 5,339,461 A | 8/1994 | Luplow |
| 5,481,607 A | 1/1996 | Hsiao |
| 5,684,883 A | 11/1997 | Chen |
| 6,282,289 B1 | 8/2001 | James et al. |
| 6,324,285 B1 | 11/2001 | Dowsett et al. |
| 6,597,788 B2 | 7/2003 | James et al. |
| 6,679,448 B1 | 1/2004 | Carpenter et al. |
| 6,763,111 B2 | 7/2004 | Liao |
| 6,957,978 B2 | 10/2005 | Zoller |
| 7,001,210 B1 | 2/2006 | Chiang |
| 7,052,281 B1 | 5/2006 | Meyberg et al. |

(Continued)

*Primary Examiner* — Michael Zarroli
(74) *Attorney, Agent, or Firm* — Nutter McClennen & Fish LLP

(57) ABSTRACT

A protective case for a portable electronic device which incorporates a spool assembly containing a user dispensable and retractable Industry standard or OEM charge/sync cable. The case provides the user with the utility of always having a charge/sync cable available when needed while being discreetly housed in a low-profile ergonomically pleasing package. The case and spool assembly provide the user with up to 3 Ft or more of cable available for dispensing from the case while allowing the portable electronic device to be charged/synced at any desired dispensed length of cable, and can be manufactured using any thermoplastic, metal, wood, or composite. The dispensed cable and connector can be rewound onto the spool manually using the spool finger pockets.

24 Claims, 9 Drawing Sheets

(56) References Cited

U.S. PATENT DOCUMENTS

| | | |
|---|---|---|
| 7,104,816 B1 | 9/2006 | Wang |
| 7,108,544 B2 | 9/2006 | Zoller |
| 7,255,595 B2 | 8/2007 | Lo |
| 7,297,001 B2 | 11/2007 | Wu |
| 7,335,053 B2 * | 2/2008 | Avevor .................. H01R 13/60 439/502 |
| 8,123,552 B2 | 2/2012 | Hsu et al. |
| 8,365,887 B2 * | 2/2013 | Fischer .............. B65H 75/4431 191/12.2 A |
| 8,485,404 B2 * | 7/2013 | Monaco ................ A45C 11/00 206/320 |
| 8,531,833 B2 | 9/2013 | Diebel et al. |
| 8,579,172 B2 | 11/2013 | Monaco et al. |
| 8,634,887 B2 | 1/2014 | Hu et al. |
| 8,640,868 B2 | 2/2014 | O'Dowd et al. |
| 8,646,698 B2 | 2/2014 | Chen et al. |
| 8,774,446 B2 * | 7/2014 | Merenda ................ B65H 75/48 381/370 |
| 8,800,907 B2 * | 8/2014 | Koenig ................ H04R 1/1033 191/12.4 |
| 9,161,115 B2 * | 10/2015 | Schrems ................. H04M 1/15 |
| 2002/0003875 A1 | 1/2002 | Stewart et al. |
| 2005/0255898 A1 | 11/2005 | Huang |
| 2006/0058081 A1 | 3/2006 | Reichenbach |
| 2007/0216352 A1 * | 9/2007 | Shaddle ................ H02J 7/0044 320/114 |
| 2009/0312058 A9 | 12/2009 | Wood et al. |
| 2010/0084236 A1 | 4/2010 | Yang |
| 2012/0077556 A1 | 3/2012 | McKendrick |
| 2012/0145570 A1 | 6/2012 | Monaco et al. |
| 2013/0020425 A1 | 1/2013 | Grassi et al. |
| 2013/0029725 A1 * | 1/2013 | Heil-Brice .............. H04M 1/15 455/557 |
| 2013/0249467 A1 * | 9/2013 | Varghese ............. H02J 7/0042 320/103 |

\* cited by examiner

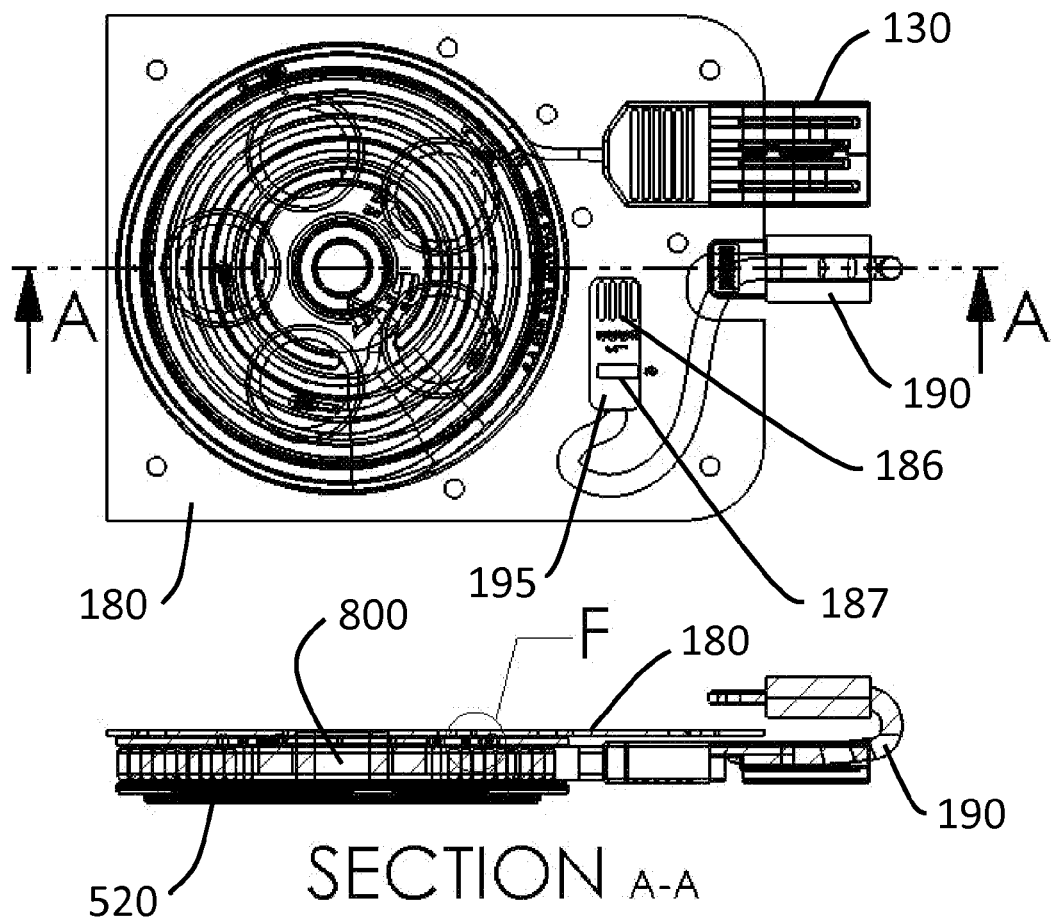
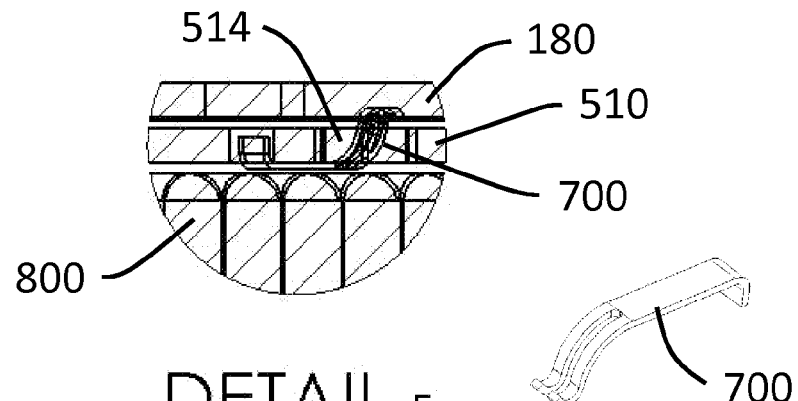
Fig 11
SECTION A-A
DETAIL F
SCALE 5:1

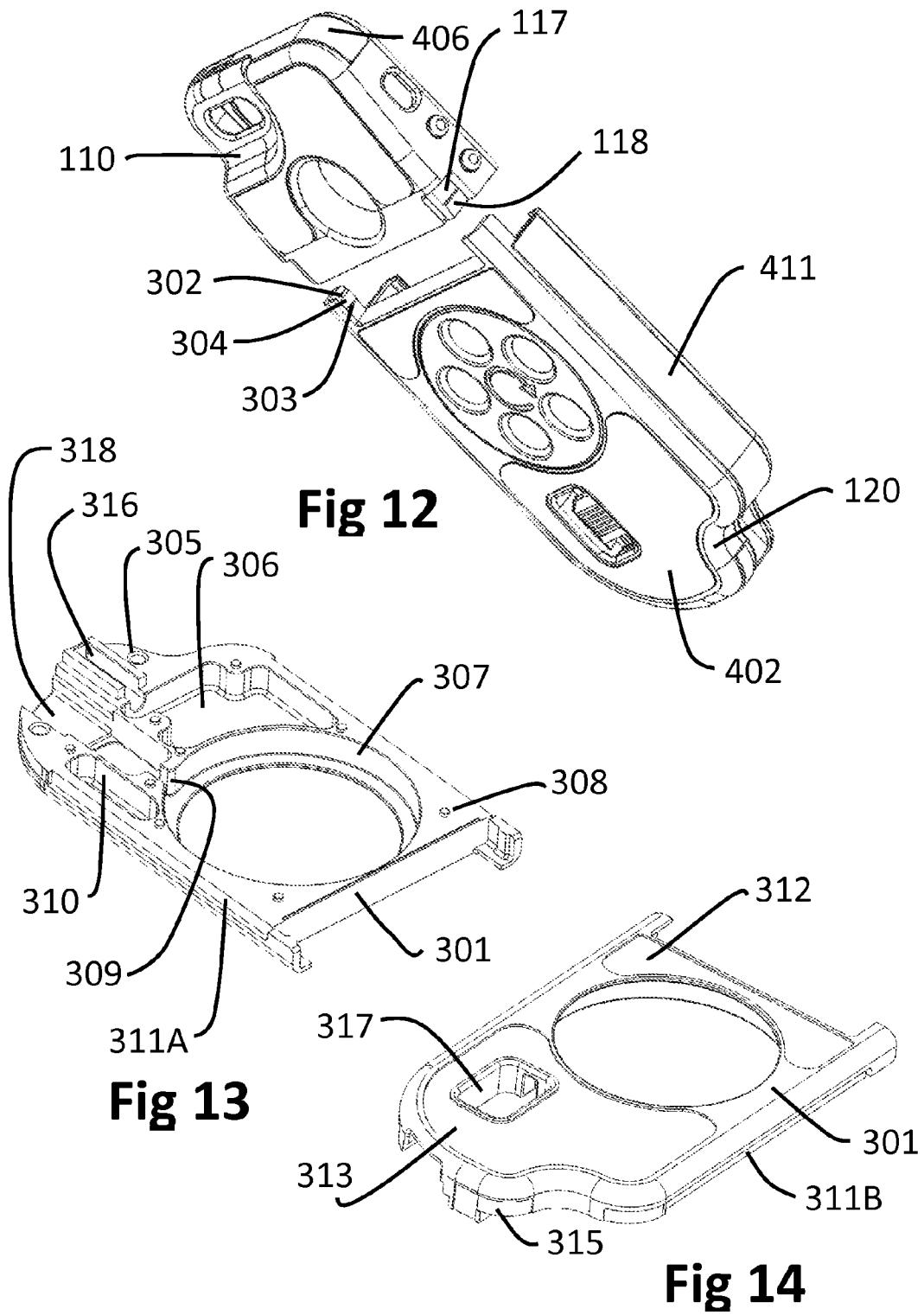

PROTECTIVE CASE FOR PORTABLE ELECTRONIC DEVICE WITH INTEGRATED DISPENSABLE AND RETRACTABLE CHARGE AND SYNC CABLE

BACKGROUND OF THE INVENTION

Today's society has adopted technology on a broad scale. This includes the adoption of personal hand held electronics for use in playing music, playing games, making phone calls, navigating the internet, tracking your exact location, checking the weather, etc. These electronic devices have taken the form of iPods®, iPhones®, iPads®, OEM Cell Phones, Personal Data Assistants (PDA's), handheld GPS navigation devices, portable music players, and the like. All of these handheld portable devices are battery powered and require charging with an external charge/sync cable specific to the OEMs charging and interconnect requirements. Today's increased use of video streaming and GPS navigation on the latest smartphones have put a strain on battery capacity and uninterrupted device use. This battery demand has required the device user to charge their devices more frequently. However, to be able to charge the device, the user must possess the charge/sync cable. In addition, the cable must be compatible with the specific OEM requirements, such as USB micro, USB mini, Lightning®, JAE 30-pin, etc. All popular electronic devices such as those listed above use a charging/sync cable that has a common distal end connector, currently at the time of filing, this distal connector is the industry standard USB Type A 4-pin shrouded male/plug connector, however the scope of this invention covers any type or gender of OEM proprietary or industry standard distal connector. This invention solves the problem of the user not having a charging/sync cable on their person when needed to recharge the portable electronic device. In addition to always physically being attached to the device and always electrically connected to the device, the distal connector is dispensable up to 3 Ft or more from the device, allowing the portable electronic device to be used as designed during the charging/sync time duration. Once charged or the sync is complete, the user can quickly and conveniently manually recoil the cable back into its low profile storage position on the portable electronic device by radially spinning the spool assembly top clockwise with the users finger placed into one or more of the spool finger pockets. This invention performs this utility in the form of two protective case assembly halves either of which may house a coiled and spooled device compatible charge/sync cable, which can be dispensed from the case assembly and returned to the case assembly using only ones fingers.

Others have devised methods to address the need for more battery power as is referenced in U.S. Pat. No. 8,646,698 Chen et al., and U.S. Pat. No. 8,531,833 whereby a protective case is fitted with an external additional battery. While this does extend battery life and thus usage time, once that time has expired, the user must find the appropriate charge/sync cable and plug the distal connector into a power and/or data source. With no cable, there is no additional/recharge power, regardless of the battery presence in the case. With this invention, the user is never without a charge/sync cable physically and electrically connected to the portable electronic device, and the user is never without the ability to plug the distal connector into a USB Type A or equivalent power source receptacle. In other prior art such as U.S. Pat. No. 6,957,978 Zoller, a means is provided to "coil" a charge/sync cable around a protruding spool feature coupled to the back of the device. While the patent covers the retraction of the spool back into the housing/case, the OEM end of the cable is not always connected/mated to the device, and the cable must be fully removed from the spool and manually connected to the portable electronic device before charging/sync. With the present invention, the charge/sync cable is always physically and electrically connected at the OEM connector end and is ready for use once the distal connector is dispensed and connected to a USB Type A or equivalent power source receptacle. U.S. Pat. No. 8,579,172 Monaco et al., provides several utilities in its case design such as drop protection, a belt clip, bottle opener, and earphone storage and dispensing, however it does not provide an integrated charge/sync cable.

While U.S. Pat. No. 7,297,001 Wu, and U.S. Pat. No. 7,255,595 Lo, is a transmission line wire winding device which is pulled at one end, it is not integrated into a protective portable electronic device case, nor does its fixed end constantly remain mated to the portable electronic device during the storage and use cycle. In addition, the present invention utilizes electrical contacts that are significantly different than those shown by Wu and Lo, and in the present invention, these contacts are applied in a manner that allows for the deflection of the contact beams within the thickness of the PCB to which they are soldered. U.S. Pat. No. 8,640,868 O'Dowd et al., and U.S. Pat. No. 8,634,887 Hu et al., show means of applying a protective case or cover to a portable device, however, the present invention utilizes different geometry to that shown in the above referenced patents to temporarily connect the 2 case halves together. More specifically, latch geometry was specifically designed in this invention that allows the two case assembly halves to be snapped together relatively easily, while remaining fairly difficult to disconnect, which provides case integrity and functionality during normal use and abuse of the portable electronic device, however allows easy de-attachment of the lower case assembly half to allow unrestricted device "docking" to $3^{rd}$ party accessory devices. U.S. Pat. No. 8,365,887 Fischer, shows a manual earphone retraction apparatus, which is not a charge/sync cable, which could be incorporated into a portable electronic device case. The embodiment and claims therein show a retraction spool with one or more "spherical" depressions for the acceptance of one's finger to wind. The present invention incorporates a similar spool, however incorporates "conical" depressions, (not "spherical" depressions as depicted and claimed in U.S. Pat. No. 8,365,887 Fischer, featuring steep side walls and flat depression bottoms which provide better finger retention in the case spool assembly during the radial winding operation. In U.S. Pat. No. 8,123,552 Hsu et al., a portable storage box is presented which is also similar to the present invention, however it is designed for external portable hard drives specifically. It also requires the device/portable hard drive to be permanently mounted to the case assembly and does not allow easy case assembly removal for device maintenance or device "docking". In US Application 2013/0020425 Grassi et al., a protective case for electronic devices is proposed which incorporates storage for earphones and a charge/sync cable. However, Grassi requires the user to remove both ends of the charge/sync cable and earphone cables from the case and then plug both ends of the charge/sync cable or earphone cable into their respective device port locations for charging and/or sync, or headphone use to occur. The present invention provides a constant mating condition to the device regardless of the length of cable dispensed, while the case assembly is attached to the portable electronic device, and allows for cable dispensing to occur from the distal end only to connect the portable electronic device to the power/sync source. In addition, due to the always connected/mated nature of the case/connector in the present invention, the life of the OEM device integrated female connector is significantly extended by reducing the number of device/cable mates required for the lifespan of the device, and reducing the portable electronic device OEM connector to exposure of moisture and debris.

BRIEF SUMMARY OF THE INVENTION

It is a primary objective of the present invention to overcome the aforementioned problems and limitations by providing a protective case for a portable electronic device which incorporates a spool assembly containing an integrated user dispensable and retractable OEM or industry standard charge/sync cable.

To achieve the aforementioned objectives the present invention provides a protective case which is comprised of 2 case housing sub-assemblies. The 2 case housing halves/assemblies are defined as 1) the nosecone housing assembly, and 2) the lower housing assembly. These 2 complimentary housing assemblies encase and protect a portable electronic device whereby the electronic device slides into a constraining pocket available on each of the case assembly halves which have flat inner back surfaces, device curve following side walls and integrated top retaining lip features. The retaining lips are optimally sized to provide reliable device retention, while also providing enough "slip-fit" clearance to allow the user to easily assemble and dis-assemble the case from the portable electronic device. The lower housing assembly includes a fixed and terminated OEM proprietary, or industry standard proximal connector which mates with the portable electronic device upon the 2 case housing halves latching together. The 2 case housing halves are joined together by an interconnecting latch with boss and pocket features that are built into each case assembly housing. The "beam" latches are symmetrical to the longitudinal or y-axis of the device, and are designed to allow easy assembly and latching of the 2 halves, while providing a higher retraction or dis-assembly force to provide case integrity during normal assembled/latched use and abuse. The dis-assembly force is such that dis-assembly is still relatively easy with a moderate tug which allows for the lower housing assembly to be removed for device maintenance, cleaning, or docking to 3$^{rd}$ party accessories.

The nosecone housing assembly contains geometric features that allow for the uninhibited and unrestricted use of the device interfaces, such as the on/off switch and the up and down volume buttons. The nosecone housing also has a recessed camera viewport for unrestricted and unaltered photo/video functionality of the device. In addition, the nosecone housing has optional geometric features that allow for the viewing of a device OEM logo. The nosecone housing is designed to be compatible with injection molding manufacturing and has been designed to be compatible with industry standard mold design and/or machining processes. The nosecone housing can be made using any commercially available thermoplastic such as ABS® or any metal, wood, or composite. The nosecone housing has several shallow pockets on its surface designed to accept thin protective and anti-slip elastomeric decals, each with adhesive on one side.

The lower housing assembly is comprised of an upper and lower housing half, a spool assembly comprised of a stator PCB assembly, an Industry standard USB Type A connectorized and terminated pigtail assembly, a rotor PCB and contact assembly, an OEM Industry standard connector pigtail assembly, and protective/anti-slip elastomeric decals, each with adhesive on one side. The lower housing assembly upper and lower housing halves have been designed to be compatible with injection molding manufacturing and have been designed to be compatible with industry standard mold design. The lower housing upper and lower housing halves can be made using any commercially available thermoplastic such as ABS®, any metal, wood, or composite. The lower housing upper & lower housing halves have several shallow pockets on their surfaces which are designed to accept thin protective and anti-slip decals of rubber, each with a PSA adhesive on one side.

The present invention allows the user to dispense the USB Type A charge/sync connector by pulling at only one end, with more than 3 ft. of charge cable being potentially pulled from the case assembly. This allows the user to fully use the features and capabilities of the electronic device while the device is charging or syncing. Once charging or syncing is complete, the present invention allows the user to quickly and easily retract or recoil the USB Type A connector and attached cable by spinning/winding the spool assembly using a finger pressed into one of the circular conical depressions on the spool top surface, or by use of a recoil spring, the cable can be automatically rewound onto the spool assembly. The present invention by means of the PCBs and electrical contacts allows the user to charge/sync the portable electronic device in any dispensed/extracted length position of USB Type A connector. The present invention can be manufactured using industry standard tooling and techniques, no special assembly tooling is required. The present invention also is manufactured using industry standard OEM cable assemblies so as to be compatible with all current and future OEM portable electronic devices such as the ever evolving designs of cell phones.

BRIEF DESCRIPTION OF THE DRAWINGS

FIG. 11. Is a combination Plan, Section, and Detail view of the Stator PCB, Rotor PCB, and Spool Assembly shown in the assembled condition. This view is meant to highlight the electrical contact and its normal force deflection condition, and that the deflection occurs in plane with the thickness of the rotor PCB to which it is soldered.

FIG. 12. Is a back left ISO view of the case assembly only with the nosecone assembly and lower housing assembly slightly unmated to highlight the interlocking features of both assemblies.

FIG. 13. Is a top right ISO of the lower housing lower half to highlight the lower housing lower half features.

FIG. 14. Is a back right ISO of the lower housing lower half to highlight the lower housing lower half features.

DETAILED DESCRIPTION OF THE INVENTION

Figure 1:
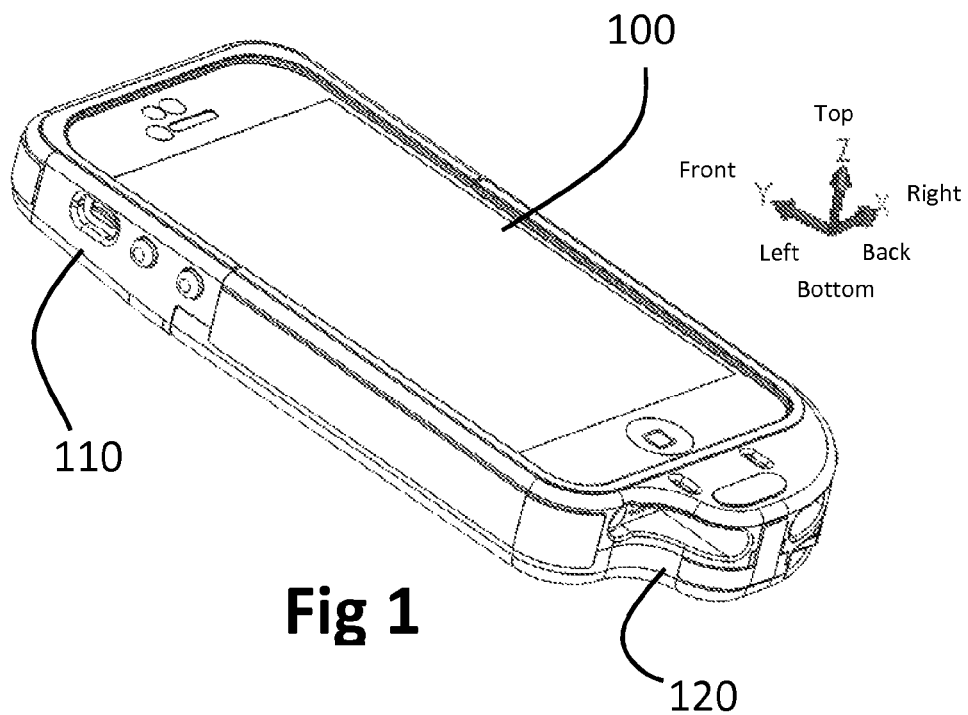
FIG. 1. Is a top left ISO view of the invention in its assembled condition with the USB Type A charge/sync connector in its stored condition.

FIG. 1. Is a top left ISO view of the 2 protective case housing halves, nosecone housing assembly 110 and lower housing assembly 120 fully mated and assembled for use with a known portable electronic device 100. The coordinate system shown in FIG. 1., identifies the directions and axis referenced in this embodiment.

Figure 2:
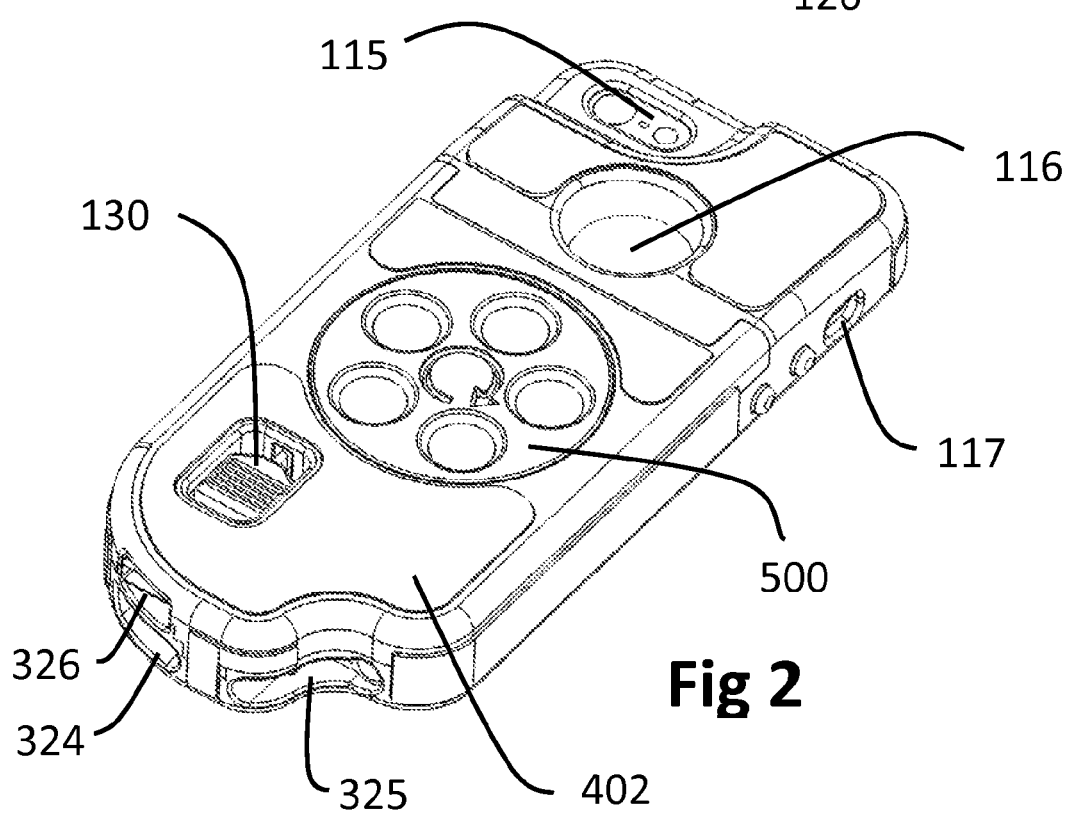
FIG. 2. Is a bottom right ISO view of the invention in its assembled condition with the USB Type A charge/sync connector in its stored condition.

FIG. 2. Is a back left ISO view of the 2 protective case housing halves, nosecone housing assembly 110 and lower housing assembly 120 fully mated and assembled for use with a known portable electronic device 100. As can be seen in FIG. 2, the protective case allows for the full and uninhibited use of the device functionality through the nosecone housing assembly viewport 115 and nosecone housing assembly mute pocket 117 and lower housing assembly speaker/microphone Port A 324 and lower housing assembly speaker/microphone Port B 325. The present invention applies to all forms and manufacturers of portable electronic devices, and therefore different variations may include various "windows" or "ports" in various geometric positions on the protective case housing halves such as to highlight a manufacturer's logo, as is shown in the nosecone housing assembly core window 116. FIG. 2. Additionally highlights the lower housing assembly spool assembly 500 which is used to hold the industry standard charge/sync cable pigtail assembly 800 and the lower housing assembly USB Type A connector assembly 130. The lower housing assembly USB Type A access port 326 is used to allow for the containment and protection of the lower housing assembly USB Type A connector assembly 130, and to allow for the dispensing and retracting/rewinding of the industry standard charge/sync cable pigtail assembly 800 and the lower housing assembly USB Type A connector assembly 130 through the body of the lower housing assembly 120. In addition, FIG. 2. Shows the elastomeric decal (such as rubber)—lower housing assembly—lower bottom 402. This rubber decal and others that will be described later in this embodiment are designed for 3 main purposes, 1) drop and bump damage protection, 2) anti-slip properties in one's hands and on hard surfaces, 3) aesthetic beautification and style. In addition, the use of adhesive backed rubber decals allows for the maintenance and repair of the functionality described above. The decals can be made of any elastomeric material such as rubber, and can be of any color, or have any design or image imprinted on their top surface. The decals can be of smooth texture, or any other rougher texture or 3D profile/contour, and can be of any practical or varying thickness and not be limited to the 0.032" constant thickness shown in the invention drawings. In both FIG. 1 and FIG. 2, the lower housing assembly USB Type A connector assembly 130 is shown in its fully retracted and stored condition.

Figure 3:
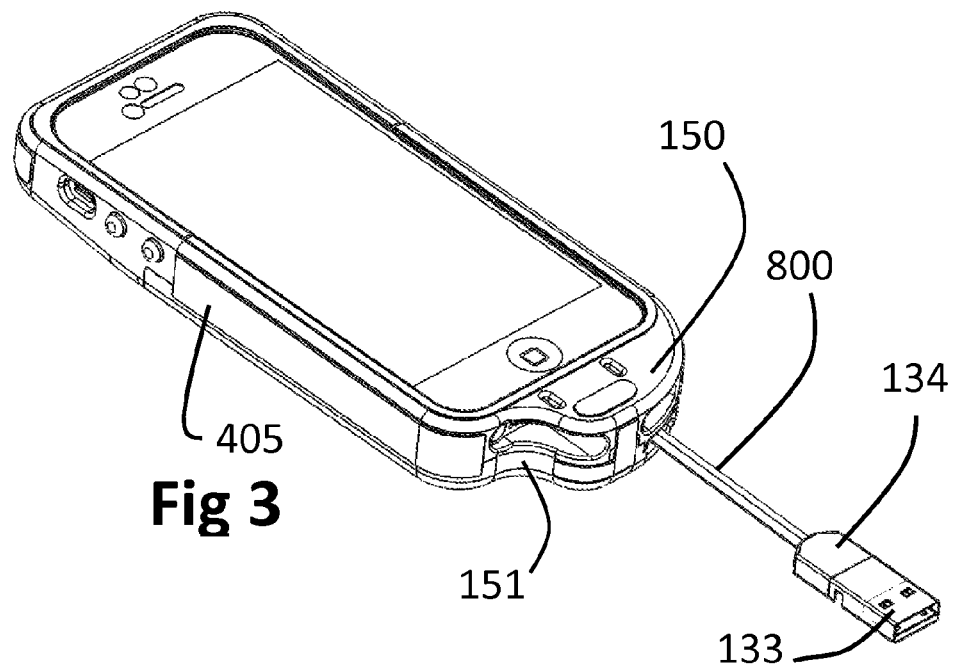
FIG. 3. Is a top left ISO view of the invention in its assembled condition with the USB Type A charge/sync connector in its partially dispensed position.
Figure 4:
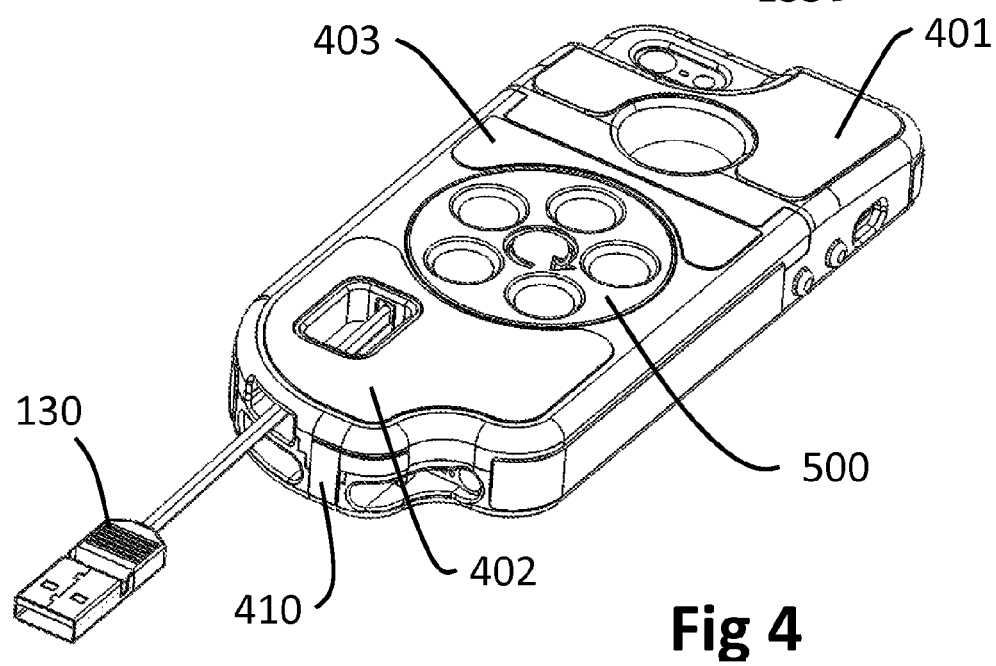
FIG. 4. Is a bottom right ISO view of the invention in its assembled condition with the USB Type A charge/sync connector in its partially dispensed position. Some of the elastomeric decals are highlighted in this view.

FIG. 3. Again shows a top-left ISO view of the 2 protective case housing halves, nosecone housing assembly 110 and lower housing assembly 120 assembled for use with a known portable electronic device 100. FIG. 3., also shows the industry standard charge/sync cable pigtail assembly 800 and its associated Overmold USB type A 134 and connector USB Type A 133 shown in a partially dispensed position. The invention may include any nominal full length of cable that will fit onto a spool assembly and is not limited to any specific fully dispensed/extracted length. For the present invention, the spool holds approximately 3 Ft of extendable cable. This 3 Ft length allows the user to fully utilize the portable electronic device 100 while the device is plugged into a charge/sync port such as those found on laptop and desktop computers and more recently being integrated into vehicle cabins and wall electrical outlets. FIG. 3 also shows the "butt-out" 150 of the housing 120 which extends a minimum of 0.21 inches from the device charge/sync port face to provide a surface area for one-handed holding of the electronic device without obscuring the device screen. The bump-out 150 also provides the housing space to accommodate the proximal device connector and its associated 180 degree bend of the cable. The bump-out also creates a corresponding "nook" 151. This nook provides the user with a tactile way to discern the orientation of the portable device in one's pocket, or in poorly lit or visually obscured conditions.

Figure 5:
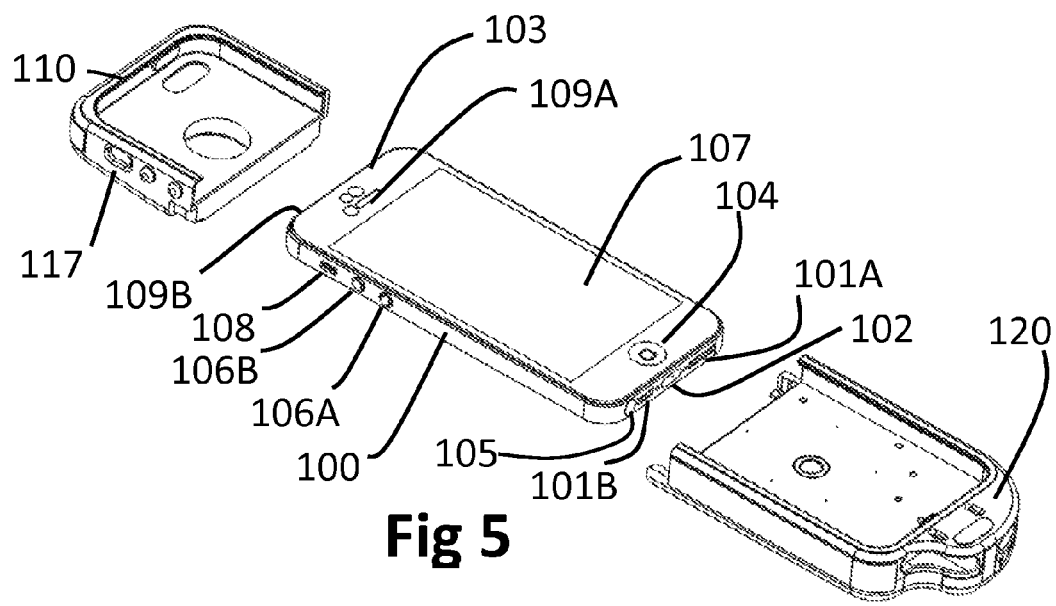
FIG. 5. Is a top left ISO view of the device with the nosecone assembly and lower housing assembly shown in their unmated condition. All relevant device features are defined in this view.

FIG. 5. Shows the nosecone housing assembly 110, and the lower housing assembly 120 dis-assembled from the portable electronic device 100. This dis-assembly of the nosecone housing assembly 110 is performed by the user by applying a Y-axial force that is sufficient to overcome the latching force imparted by latching features 117, 118, 302, 303 shown in FIG. 12. The complete removal of the nosecone housing assembly 110 is accomplished by overcoming the friction forces of the volume up button 203 and volume down button 202 shown in FIG. 17. Dis-assembly of the lower housing assembly 120 from the portable electronic device 100 is performed by the user by applying a Y-axial force that is sufficient to overcome the latching force imparted by latching features 117, 118, 302, 303 shown in FIG. 12. For purposes of "docking" the portable electronic device 100 with $3^{rd}$ party accessories such as a with a portable music player/speakers, the nosecone housing assembly 110 can be left in the assembled state on the portable electronic device 100 while only the lower housing assembly 120 is easily and temporarily removed. FIG. 5., also shows typical features found on a portable electronic device such as the electronic device on/off switch 103, the electronic device top camera 109A, the electronic device bottom camera 109B, the electronic device screen 107, the electronic device interface button 104, the electronic device speaker/microphone A 101A, the electronic device speaker/microphone B 101B, the electronic device charge/sync port 102, the electronic device headphone port 105, the electronic device volume down button 106A, the electronic device volume up button 106B, and the electronic device mute switch 108.

Figure 6:
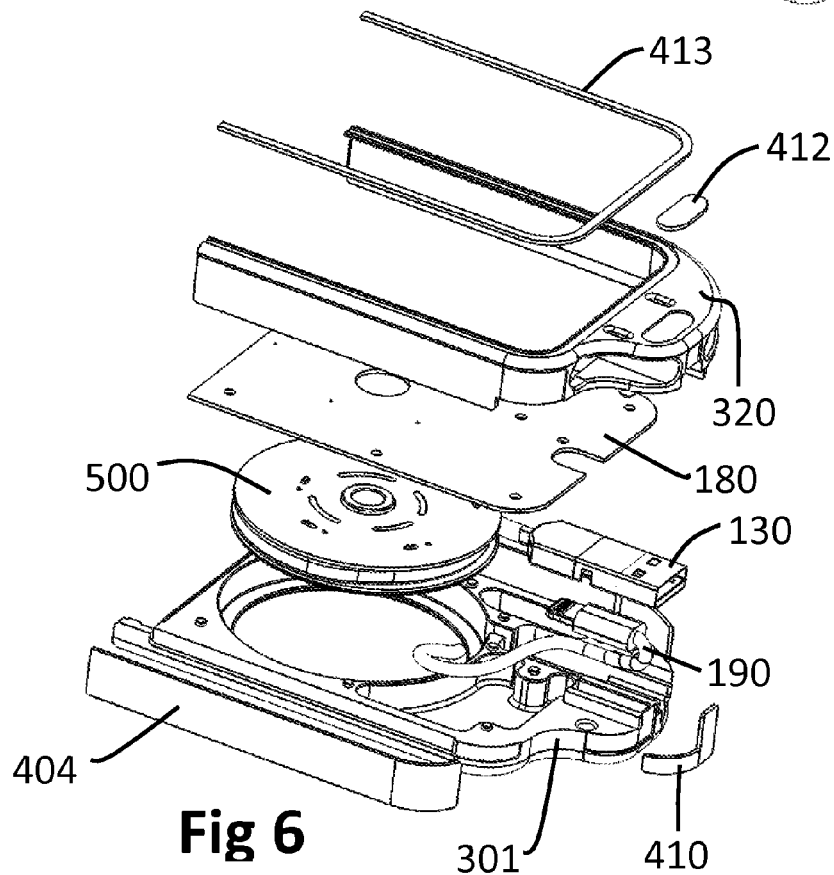
FIG. 6. Is a top left ISO view of the lower housing assembly shown in its exploded state.

FIG. 6., Shows a top left ISO exploded view of the lower housing assembly 120. The lower housing assembly lower half 301 can be made of any thermoplastic, metal, wood or composite, and forms the base of the lower housing assy. The lower housing assembly upper half 320 can be made of any thermoplastic, metal, wood, or composite, and is permanently glued or bonded to the lower housing assembly lower half 301 using the housing latching features 311 and 308 shown in FIG. 13., latching feature 314 shown in FIG. 14., and interlock lips 327 and alignment posts 321 shown in FIG. 15. The lower housing assy OEM connector pigtail assy 190 is shown in an exploded position in FIG. 6. and is not modified from its vendor or OEM supplied condition, however the cable 800 has been cut approximately 3 inches from the connector shown in FIG. 6 to allow the pigtail assy 190 to be electrically terminated to the lower housing stator PCB 180. The lower housing assembly spool assembly 500, and lower housing assembly USB Type A connector assembly 130, is shown in its exploded position in FIG. 6., and interacts with the lower housing halves 301 and 320, and lower housing assembly stator PCB 180. Also shown in FIG. 6. are various rubber decals used to provide protection and anti-slip functionality as well as aesthetic beautification of the protective case. These decals are the lower housing assembly top trim 413, lower housing assembly top thumb rest 412, lower housing assembly left side 404, and lower housing assembly back 410.

Figure 7:
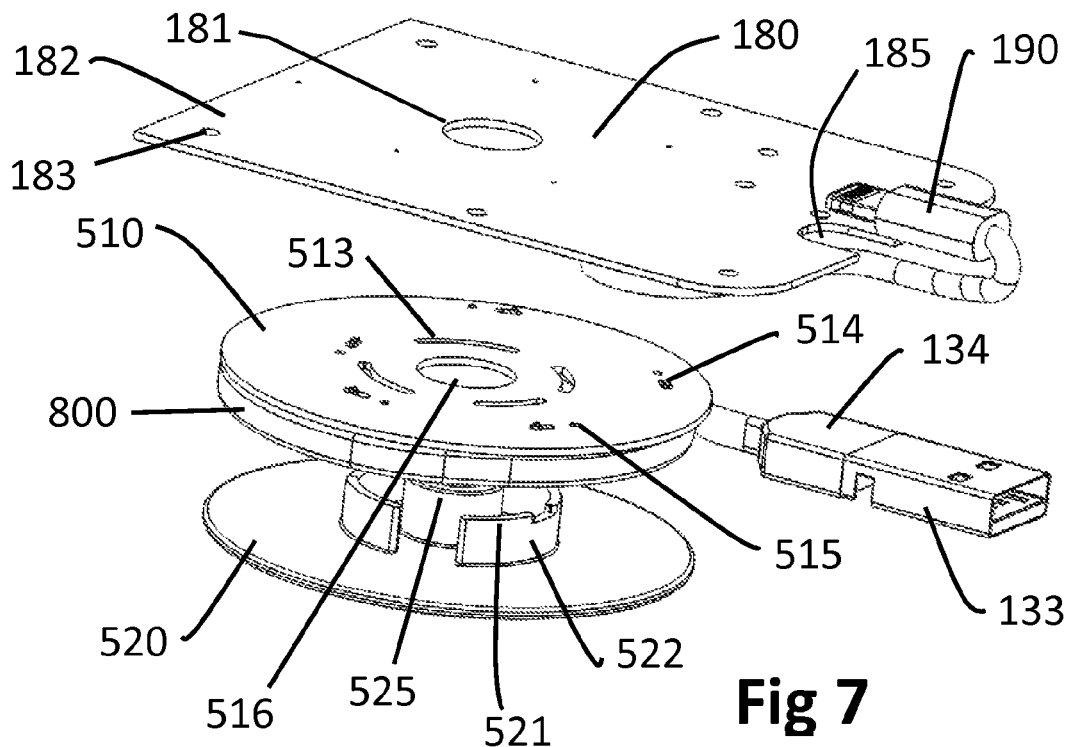
FIG. 7. Is a top left ISO view of the stator PCB, rotor PCB and spool assembly shown in an exploded state.

FIG. 7., is a top left ISO view of the following isolated main components, the lower housing stator PCB 180, the lower housing OEM connector pigtail assembly 190, and the lower housing assembly spool assembly 500. Looking at the lower housing and assembly stator PCB 180 in more detail, it can be seen that there are several alignment/mounting holes 183 which are used to align and mount the stator PCB 180 to the lower housing assembly lower half 301. Also shown are the stator PCB via holes 183 which are used to connect the PCB top and bottom traces together electrically. The stator PCB center hub hole 181 is used to form a radial bearing surface for the lower housing spool assembly 500. The lower housing assembly rotor PCB 510 is shown in FIG. 7., and radially interacts with the lower housing assembly stator PCB to provide continuous electrical connections between the lower housing assembly OEM connector pigtail assembly 190 and the industry standard charge/sync pigtail assembly 800 at any length of extraction from the protective case. Looking at the rotor PCB 510 in more detail, the rotor PCB anti-rotation slot 513 can be seen. This anti-rotation slot mates with and is glued/bonded to the spool top anti-rotation boss 521 and once mated creates the spool assembly 500. The width of the spool assembly that is used to accommodate the industry standard charge/sync pigtail assembly 800 is determined by the spool top cable width boss 522. The rotor PCB contact heel mount 515 is used to locate, align and electrically terminate the rotor PCB contact 700 shown in FIG. 11. The rotor PCB contact deflection slot 514 is used to locate, align, and provide a z-axis space for the PCB contact 700 to deflect upon assembly and provide a sufficient normal force to the stator PCB constant contact pads 184, 185, 186, 187, and 188 shown in FIG. 8. The rotor PCB center hub hole 516 is used to allow the rotor PCB center hub 525 to pass through it and interact with the stator PCB center hub hole 181. Also shown in FIG. 7. is the overmold USB Type A 134 and connector USB Type A 133 which are used to interface with the power source or computer for syncing.

Figure 8:
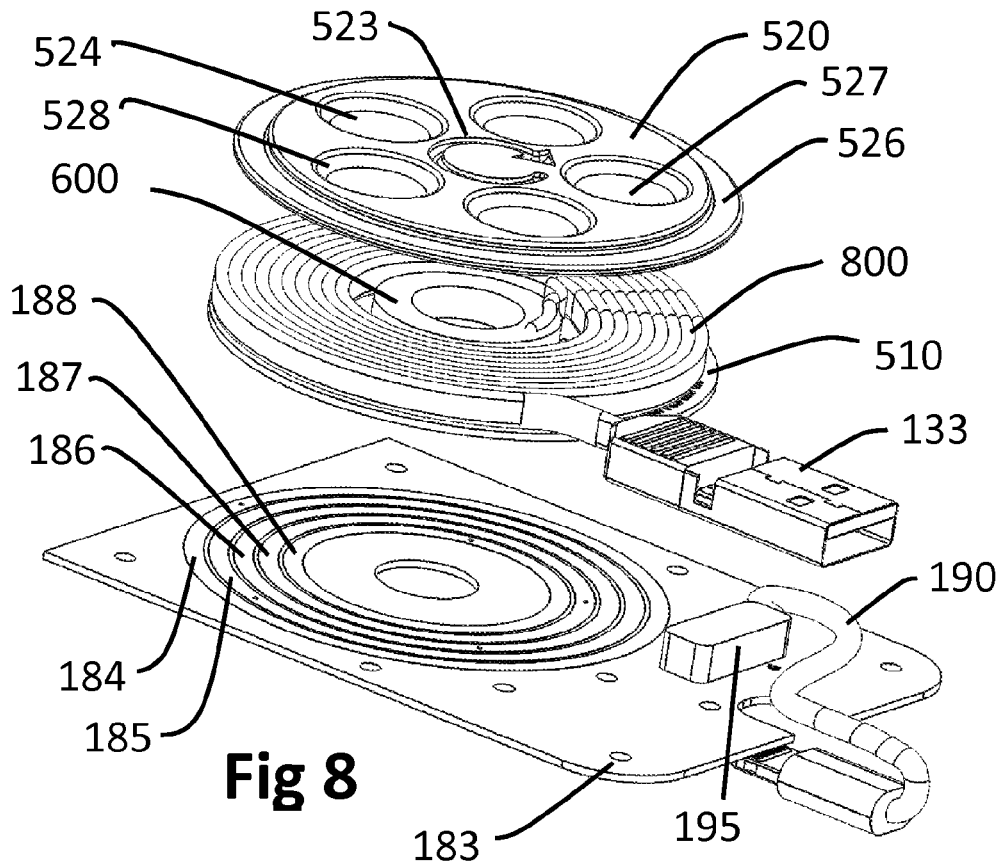
FIG. 8. Is a bottom left ISO view of the stator PCB, rotor PCB and spool assembly shown in an exploded state.

FIG. 8., is a bottom left ISO view of the following isolated main components, the lower housing stator PCB 180, the lower housing OEM connector pigtail assembly 190, and the lower housing assembly spool assembly 500. A closer look at the spool top 520 shows at least one radially spaced spool top finger depression 524 used to retain the users finger during the rewinding/recoiling process of retrieving and storing the lower housing assembly USB Type A connector assembly 130 into the case assembly. Other features of the spool top finger depression 524 are the spool top finger depression floor 527 which serves at the bottom of the depression, and the spool top finger depression conical wall 528 which is used to retain the users finger in the depression during the rewinding process of retrieving and storing the lower housing assembly USB Type A connector assembly 130 into the case assembly. The spool top rewind direction arrow 523 is shown in FIG. 8., and is provided as a visual aid for proper rewinding/recoiling operation. The spool top rotation bearing surface 526 is used to retain the spool assy 500 in the lower housing assembly 120 by bearing on the lower housing lower half spool pocket 307 shown in FIG. 13. Also shown in FIG. 8. Is the spool assembly epoxy strain relief ring 600 which is potted in place over the solder terminations of the industry standard charge/sync pigtail assembly 800 to provide axial strain relief of the cable assembly when the cable is fully extracted and experiences an y-axis pull force from the user.

Figure 9:
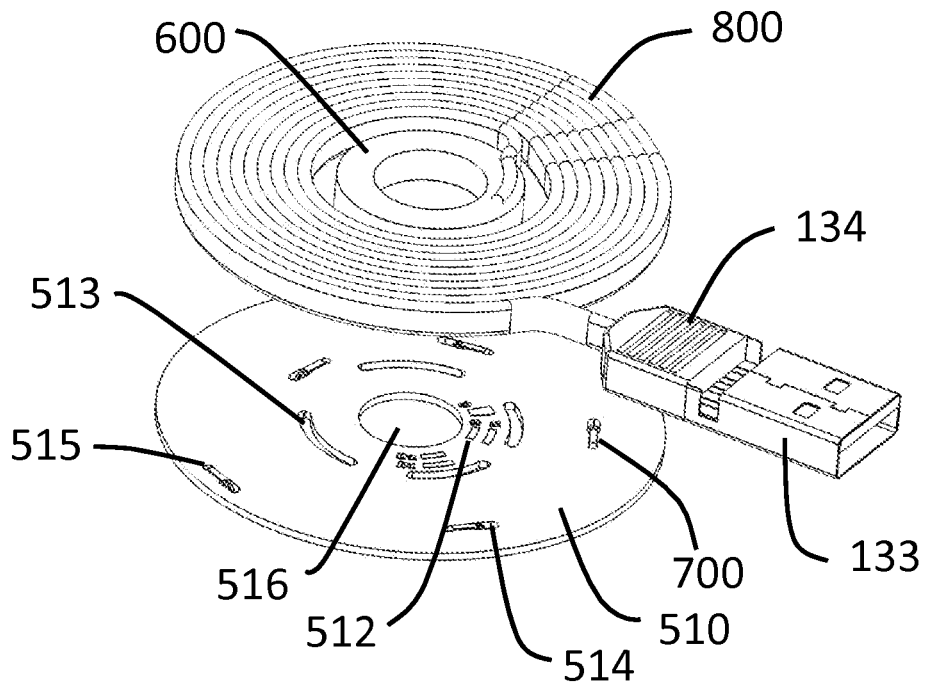
FIG. 9. Is a bottom left ISO view of the rotor PCB and coiled USB Type A cable assembly shown in an exploded state.

FIG. 9., is a bottom left ISO view of the lower housing spool assembly 500 shown in an exploded state. The rotor PCB contact 700 is shown assembled to the rotor PCB 510 by means of surface mount soldering techniques. The contact 700 is constrained to the PCB by means of a solder joint to the corresponding PCB wire termination pad 512, and by the solder surrounding the "heel" of the contact 700 and wetted to the PCB plated thru hole 515.

Figure 10:
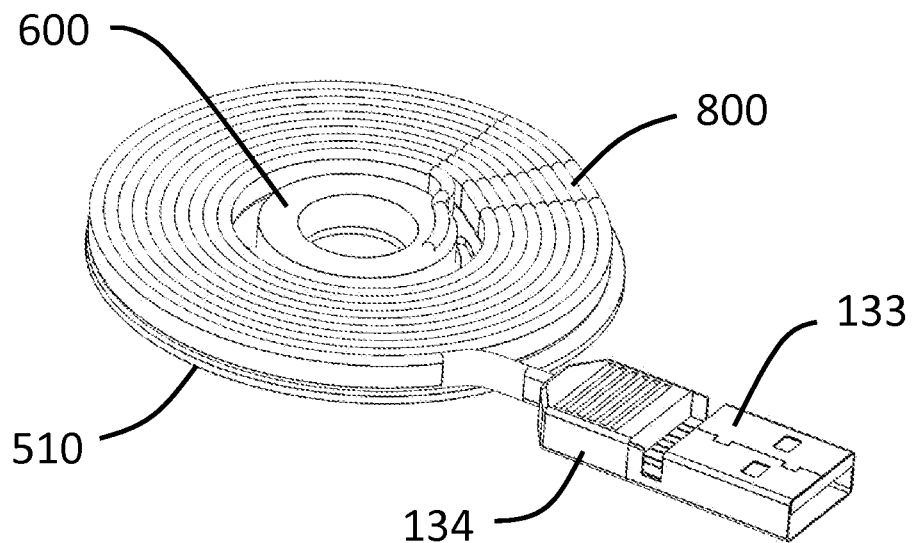
FIG. 10. Is a bottom left ISO view of the rotor PCB and coiled USB Type A cable assembly shown in an assembled state.

FIG. 10., is a top left ISO view of the lower housing spool assembly 500 shown in an assembled state. The industry standard charge/sync pigtail assembly 800 is shown in its soldered position to the rotor PCB 510, and encapsulated in the epoxy strain relief ring 600. The encapsulation material may be of any suitable potting material such as but not limited to, glue, epoxy, thermoplastic resin, etc. The encapsulate is designed to adhere to the rotor PCB 510, and to the conductors and jacket material of the industry standard charge/sync pigtail assembly 800 to provide y-axis strain relief during user extraction of the USB connector assembly 130. The axial strain relief performance shall be sufficient to provide damage protection during normal use and abuse by the user.

FIG. 11., shows a top plan view of the isolated components the lower housing stator PCB 180, the lower housing OEM connector pigtail assembly 190, and the lower housing assembly spool assembly 500. The lower housing OEM connector pigtail assembly 190 is soldered to the stator PCB 180 by means of the stator PCB wire solder pads 186 and stator PCB ground solder pad 187. FIG. 11., section A-A shows the section view of the isolated components the lower housing stator PCB 180, the lower housing OEM connector pigtail assembly 190, and the lower housing assembly spool assembly 500 used to identify Detail F. FIG. 11., shows a 5:1 scale view of the lower housing assembly stator PCB 180, the lower housing assembly rotor PCB 510, the rotor PCB contact 700, and the industry standard charge/sync pigtail assembly 800 shown in the assembled condition. Detail F shows a cross section view of the assembly and highlights the rotor PCB contact deflection slot 514 which allows the rotor PCB contact 700 to deflect upon spool assembly creating a contact bearing normal force sufficient to create a reliable and constant electrical connection between the rotor PCB 510, and the stator PCB 180 which completes the electrical connections of the industry standard charge/sync pigtail assembly 800 and the lower housing OEM connector pigtail assembly 190, which when in the assembled state shown in FIG. 1, will allow for the charging and/or syncing of the portable electronic device 100 when the lower housing assembly USB Type A connector assembly 130 is extracted from the case by the users finger and is plugged into a USB Type A power source or computer USB port. The rotor PCB contact 700 utilizes 2 deflection beams for redundant 2 point contact with the stator PCB 180 constant contact pads 184, 185, 186, 187, and 188 shown in FIG. 8.

FIG. 12., is a bottom left ISO view of the protective case assembly with the lower housing assembly 120 shown slightly disengaged from the nosecone housing assembly 110. The lower housing assembly 120 is connected and retained to the nosecone housing assembly 110 by means of the symmetrically opposed latching features comprised of the nosecone latching pocket 117 and the corresponding lower housing latching boss 304. The resultant latching force shall be sufficient to retain the nosecone housing assembly 110, and the lower housing assembly 120 together during normal device usage, and thereby protectively encasing the portable electronic device 100. The nosecone latch lead-in ramp 118, is designed in such a manner as to have the lead-in angle be shallow with respect to the steeper ramp angle of the lower housing latching ramp 303. This design intent results in a smaller y-axis force being required to mate/latch the lower housing assembly 120 to the nosecone housing assembly 110, and a relatively higher y-axis force being required to un-mate/de-latch the lower housing assembly 120 from the nosecone housing assembly 110. This assures that the 2 housing halves do not inadvertently become de-latched during normal use of the portable electronic device 100. The latching of the two housing halves is accomplished by the beam deflection of the symmetrical lower housing latching bosses 304, and the subsequent relaxing of those bosses to nest into the corresponding symmetrically opposed nosecone housing latching pockets 117. The magnitude of the mating/latching force of the 2 housing halves is controlled by the lead-in angle of the nosecone housing latch lead-in ramp 118, the height of the lower housing latching bosses 304, and the depth of the lower nosecone latching pockets 117. All nosecone housing latch features are designed to be compatible with current industry standard injection molding and machining techniques. Also shown in FIG. 12., are more adhesive backed rubber decals such as the rubber decal nosecone assy front 406, the rubber decal lower housing assembly left side 411, and the rubber decal lower housing assembly lower bottom 402. These rubber decals are designed to mount in shallow conformal pockets in the nosecone housing assembly 110, and the lower housing assembly 120, and by design of the depth of the pockets and the thickness of the adhesive backed rubber decals, the exposed top surface of the decals shall protrude beyond the top surfaces of the nosecone housing assembly 110, and the lower housing assembly 120, which adds non-slip functionality of the case assembly, as well as shock absorbing drop or bump protection functionality.

FIG. 13., is atop right ISO view of the lower housing lower half 301, which can be made of any thermoplastic, metal, wood, or composite, and can either be manufactured by means of injection molding or machining. The lower housing lower half 301, is designed to mate and be permanently bonded to the lower housing upper half 320 shown in FIG. 15. The intent of having a lower housing lower half 301 and a lower housing upper half 320 is to allow each half to be easily manufactured by means of injection molding or machining. The lower housing lower half alignment mating holes 305, are used in combination with the lower housing lower half alignment/mating posts 308, to align the lower housing lower half 301 to the lower housing upper half 320 during the manufacturing bonding process of the two halves to each other. In addition, to add strength to the lower housing assembly, the symmetrically opposed lower housing lower half interlock pockets 311A and 311B, mate and are permanently bonded with the corresponding lower housing upper half interlocking lips 327A, and 327B. The lower housing lower half OEM pigtail strain relief pocket 306 is used to provide a space for the excess cable to "live" after assembly/bonding of the stator PCB 180 to the lower housing assembly lower half 301. The lower housing lower half spool pocket is designed to constrain the spool assembly 500 as the lower housing connector assembly 130 is extracted and retrieved by means of rotation about the z-axis. The lower housing lower half cable restricting slot 309 is designed to orient the OEM pigtail cable assembly 800 with the orientation of same cable assembly as it is wound onto spool assembly 500. This rectangular aperture/slot matches the profile of the pigtail cable assembly 800, and assures that the cable will not get twisted on the spool and assures consistent reliable operation of the spool assembly 500. The lower housing lower half core pocket 310 provides no functional or aesthetic function to the invention, however provides a more consistent wall thickness of the lower housing lower half component 301, and prevents unwanted defects in the injection molding process such as sinks or unwanted warping. The lower housing lower half USB port pocket 318, is designed to guide and constrain the lower housing connector assembly 130, as it engages/enters/exits the lower housing assembly 120.

FIG. 14., is a bottom right ISO view of the lower housing lower half 301, where the lower housing lower half USB Type A dispensing pocket 317 is designed to allow user to advance the lower housing connector assembly 130 sufficiently past the entry/exit face of the lower housing assembly 120, such that the user can grab the lower housing connector assembly 130, with one's fingers to extract a desired length of the OEM cable assembly 800, to reach the external power source and/or data port. Also shown in FIG. 14., are several shallow rubber decal pockets, such as the lower housing lower half upper bottom decal pocket 312, the lower housing lower half left side decal pocket 314, the lower housing lower half back decal pocket 315, and the lower housing lower half lower bottom decal pocket 313, which are designed to accept the thickness of the corresponding adhesive backed rubber decals, whereas the exposed top surface of the decals shall protrude some distance beyond the top surfaces of the nosecone housing assembly 110, and the lower housing assembly 120, which adds non-slip functionality of the case assembly, as well as shock absorbing drop or bump protection functionality.

The lower housing lower half OEM pigtail strain relief pocket 316, is designed to provide a minimum of 0.21 inches of y-axis space where the OEM pigtail assembly 190 can make a 180 degree transition during assembly.

Figure 15:
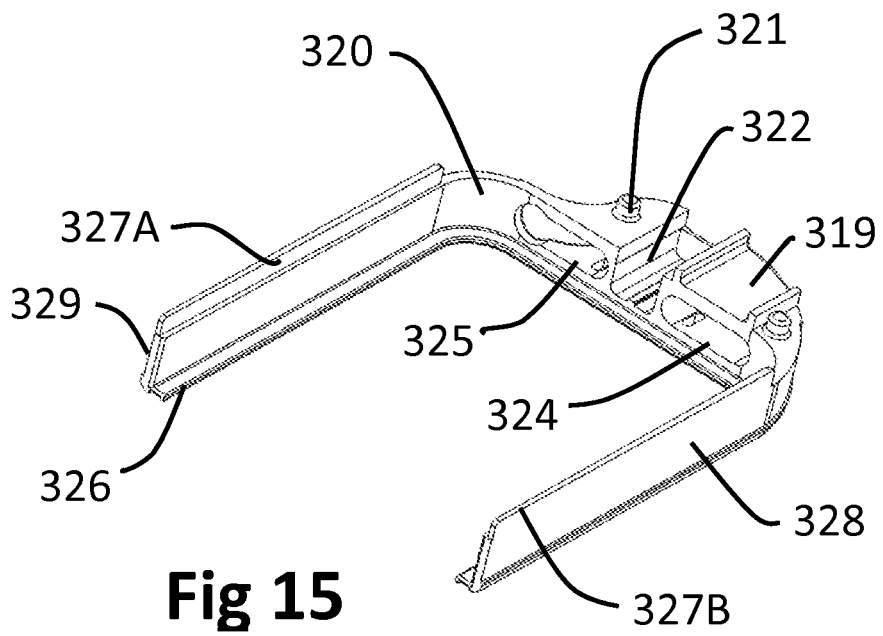
FIG. 15. Is a bottom left ISO of the lower housing upper half to highlight the lower housing upper half features.

FIG. 15., is a bottom left ISO view of the lower housing upper half 320 showing the lower housing upper half alignment/mounting posts 321, which are used during alignment and permanent bonding to the lower housing assembly lower half 301 and its alignment/mating holes 305. The lower housing upper half OEM pigtail pocket 322, is designed to provide a space where the OEM pigtail assembly 190 can make a 180 degree transition during assembly. The lower housing upper half USB Type A pocket 319, is complimentary to feature 318, and is designed to allow the user to advance the lower housing connector assembly 130 sufficiently past the entry/exit face of the lower housing assembly 120, such that the user can grab the lower housing connector assembly 130, with one's fingers to extract a desired length of the OEM cable assembly 800 to reach the external power supply or sync port. Both the lower housing lower half 301, and the lower housing upper half 320, have been designed to be compatible with current industry standard injection molding and machining techniques. The lower housing upper half speaker/microphone Port A 324, and the lower housing upper half speaker/microphone Port B 325, are designed to allow for the undisturbed sound access and egress to the portable electronic device speaker/microphone Ports 101A and 101B. The symmetrically opposed lower housing upper half interlocking lips 327A and 327B are designed to mate and be permanently bonded with the lower housing lower half interlock pockets 327A and 327B to add mechanical strength and stability to the lower housing assembly 120. The lower housing upper half device retaining lip 326 is designed to retain the portable electronic device 100 in the z-axis when assembled into the lower housing assembly 120, and to provide a surface to accommodate the top trim decal pocket 329 shown in FIG. 16. The lower housing upper half side decal pockets 326 and 327 have depths of the pockets designed to accept the thickness of the corresponding adhesive backed rubber decals, whereas the exposed top surface of the decals shall protrude some distance beyond the top surfaces of the nosecone assembly 110, and the lower housing assembly 120, which adds non-slip functionality of the case assembly, as well as shock absorbing drop or bump protection functionality.

Figure 16:
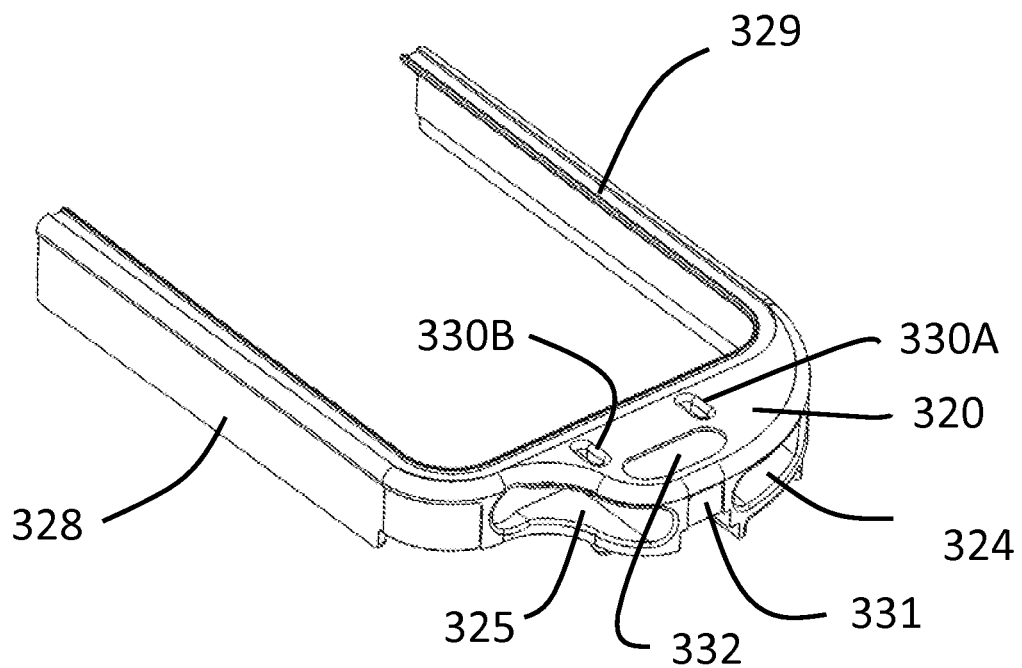
FIG. 16. Is a top left ISO of the lower housing upper half to highlight the lower housing upper half features.

FIG. 16., is a top left ISO view of the lower housing upper half 320, where the lower housing upper half top trim decal pocket 329, the lower housing upper half back decal pocket 331, and the lower housing upper half top thumb rest decal pocket 332, are designed to accept the thickness of the corresponding adhesive backed rubber decals, whereas the exposed top surface of the decals shall protrude some distance beyond the top surfaces of the nosecone assembly 110, and the lower housing assembly 120, which adds non-slip functionality of the case assembly, as well as shock absorbing drop or bump protection functionality. The lower housing upper half top mic ports 330A and 330B are designed to allow for sound access and egress from the portable electronic device speaker/mic ports 101A and 101B.

Figure 17:
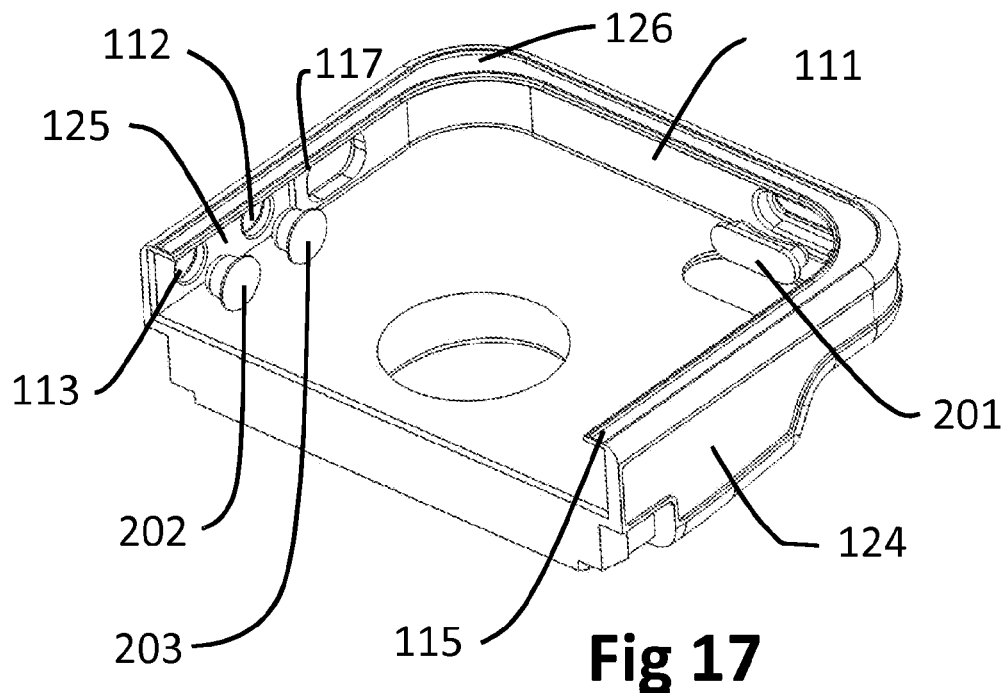
FIG. 17. Is a top right ISO of the nosecone to highlight the nosecone features.

FIG. 17., is a top right ISO view of the nosecone housing component 111, which can be manufactured using any thermoplastic, metal, wood, or composite material using any standard manufacturing process such as injection molding or machining. FIG. 17., also highlights the nosecone housing volume down button 203, and the nosecone housing volume up button 204 which are sub-components of the nosecone housing assembly 110 and may be manufactured from any thermoplastic, metal, wood, or composite using any standard manufacturing process such as injection molding or machining. Buttons 203 and 204 are designed to provide an extension of the portable electronic device volume down button 106, and volume up button 107 through the nosecone housing volume up port aperture 112, and nosecone housing volume down port aperture 113. The nosecone housing volume button relief pocket 125, is incorporated into the nosecone housing 111, to provide space for the retaining lip of the nosecone housing buttons 202 and 203. In a similar manner, the nosecone housing on/off button 201, may be manufactured from any thermoplastic, metal, wood, or composite using any standard manufacturing process such as injection molding or machining. Nosecone housing on/off button 201, is designed to provide an extension of the portable electronic device on/off button 103 through the nosecone housing on/off button port 114, allowing the user uninhibited use of the device functionality. The nosecone housing mute pocket 117 is provided to allow the user unrestricted access and use of the electronic device mute switch 108. The nosecone housing top trim decal pocket 126, and the nosecone housing right side decal pocket 124, are designed to accept the thickness of the corresponding adhesive backed rubber decals, whereas the exposed top surface of the decals shall protrude some distance beyond the top surfaces of the nosecone housing assembly 110, which adds non-slip functionality of the case assembly, as well as shock absorbing drop or bump protection functionality. FIG. 17., also highlights the nosecone housing retaining lip 115, which is designed to retain the portable electronic device 100 in the z-axis when assembled into the nosecone housing assembly 110, and to provide a surface to accommodate the nosecone housing top trim decal pocket 126. The nosecone housing device retaining lip 115, in combination with the lower housing upper half device retaining lip 326 when fully assembled and interlocked with the electronic device 100, form an unobstructed viewing port for the electronic device screen 100, the electronic device top camera 109A, and the electronic device interface button 104.

Figure 18:
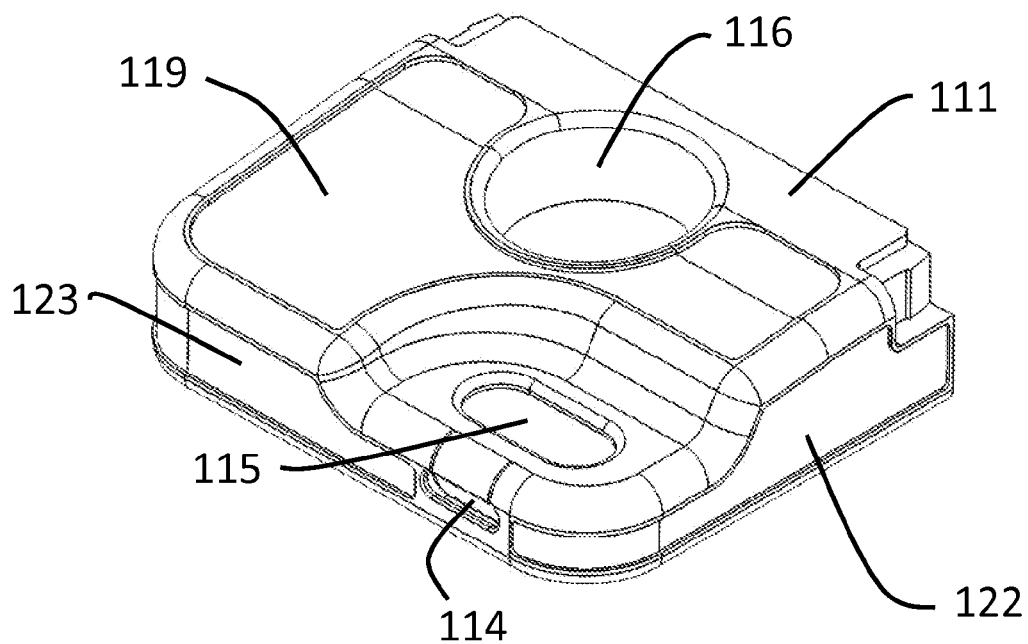
FIG. 18. Is a bottom left ISO of the nosecone to highlight the nosecone features.

FIG. 18., is a bottom left ISO view of the nosecone component 111, and highlights the nosecone housing core window 116, which is designed to allow viewing of an OEM electronic device logo, and prevents unwanted defects in the injection molding process such as sinks or unwanted warping. The nosecone housing viewport 115 is incorporated into the nosecone housing 111 to allow unaltered access to the electronic device bottom camera 109B, without imparting any unwanted image distortion or artifacts of the device imaging during normal use. The nosecone housing bottom decal pocket 119, nosecone housing front decal pocket 120, and the nosecone housing left side decal pocket 122, are designed to accept the thickness of the corresponding adhesive backed rubber decals, whereas the exposed top surface of the decals shall protrude some distance beyond the top surfaces of the nosecone housing assembly 110, which adds non-slip functionality of the case assembly, as well as shock absorbing drop or bump protection functionality and aesthetic beautification.

A protective case for a portable electronic device which incorporates a spool assembly containing a user dispensable and retractable Industry standard or OEM charge/sync cable. The case provides the user with the utility of always having a charge/sync cable available when needed while being discreetly housed in a low-profile ergonomically pleasing package. The case and spool assembly provide the user with up to 3 Ft or more of cable available for dispensing from the case while allowing the portable electronic device to be charged/synced at any desired dispensed length of cable, and can be manufactured using any thermoplastic, metal, wood, or composite. The dispensed cable and connector can be rewound onto the spool manually using the spool finger pockets. The 2 distinct case housing assemblies encase the device in a constraining pocket, utilizing ramped boss and pocket latching features to retain the case housing halves and the portable electronic device in the assembled and protected condition, while allowing the unobstructed use of the device's full functionality. The housing latching bosses and pockets are designed to provide adequate assembly integrity, while allowing for the easy removal of the lower housing assembly to provide "docking" access of the device to 3rd party accessories. The protective case utilizes several adhesive backed elastomeric decals mounted in complimentary shallow housing pockets, to provide drop and bump protection of the electronic device as well as anti-slip properties and aesthetic beautification.

What is claimed is:

1. A protective case assembly for a portable electronic device, comprising:
   a protective housing assembly,
   an integrated cable/connector assembly configured to be coupled to a standard portable electronic device charge/sync port of a portable electronic device such that the cable/connector assembly is always coupled to said charge/sync port when said portable electronic device is disposed in the protective housing assembly, and an integrated rotational spool assembly, containing a fixed length of charge/sync cable and a distal interface connector, that can be extended or retracted from the housing assembly.

2. The protective case assembly of claim 1, wherein the protective housing assembly comprises a nosecone housing and a lower housing configured to be selectively latched together.

3. The protective case assembly of claim 1, wherein the protective housing assembly includes a pocket configured to captures and retains a portable electronic device and wherein the protective housing assembly includes at least one aperture for access to user interfaces of a portable electronic device.

4. The protective case assembly of claim 1, wherein the protective housing assembly includes a pocket to house the spool assembly.

5. The protective case assembly of claim 1, wherein the distal interface connector is an industry standard USB connector or any other device specific/proprietary portable electronic device charge/sync cable connector.

6. The protective case assembly of claim 1, wherein the protective housing assembly is formed from at least one of thermoplastic, metal, organic compounds, wood, cork, and composite materials, and wherein the protective housing assembly is manufactured by at least one of injection molding, machining, and casting.

7. The protective case assembly of claim 1, wherein the case assembly when installed on a portable electronic device, still allows for access to native functions of the portable electronic device.

8. The protective case assembly of claim 1, wherein the protective case assembly includes apertures on any face thereof to allow for access and egress of sound through speaker/microphone ports of a portable electronic device when the protective case assembly is installed on the portable electronic device, and to allow mechanical mating of all accessory ports of a portable electronic device when the protective case assembly is installed on the portable electronic device.

9. The protective case assembly in claim 1, wherein the protective case assembly includes at least one extension button configured to interface with a button of a portable electronic device when the protective case assembly is installed on the portable electronic device.

10. The protective case assembly of claim 1, wherein the protective case assembly includes at least one aperture on any face thereof to allow for access and function of a camera of a portable electronic device when the protective case assembly is installed on the portable electronic device.

11. The protective case assembly of claim 2, wherein the nosecone housing and the lower housing are configured to be selectively latched together by a connection mechanism in which latching/mating and delatch/un-mating forces result in less y-axial force when mating and increased y-axial force when un-mating.

12. The protective case assembly of claim 1, further comprising a portable electronic device.

13. The protective case assembly of claim 1, wherein the cable/connector assembly is in electrical contact with said charge/sync port regardless of the deployed length of the cable.

14. A protective case assembly for a portable electronic device, comprising:
a protective housing assembly,
an integrated cable/connector assembly configured to be coupled to a standard portable electronic device charge/sync port of a portable electronic device, and
an integrated rotational spool assembly, containing a fixed length of charge/sync cable and a distal interface connector, that can be extended or retracted from the housing assembly;
wherein the protective housing assembly includes a pocket to house the spool assembly;
wherein the spool assembly comprises a stationary PCB, a rotary PCB, and a spool top component,
wherein the charge/sync cable is attached to the rotary PCB and terminated with the distal interface connector,
wherein the stationary PCB is used for the termination of an industry standard proximal device interface connector cable pigtail assembly, and to provide concentric interface pads to complete an electrical connection through the rotary PCB to the distal interface connector;
wherein the rotary PCB maintains, by use of a metallic electrical contact, at least one constant electrical connection between the distal interface connector and the proximal device interface connector cable pigtail assembly;
wherein the spool top component includes a connection hub for mounting of the rotary PCB, and wherein the spool top component includes a center wall for the charge/sync cable to wind onto, and wherein the spool top component includes finger pockets comprising conical angled walls which terminate in the spool top component to a flat bottom finger surface to allow for manual retraction of the charge/sync cable.

15. The protective case assembly of claim 1, wherein the spool assembly includes an axial hub and wherein the charge/sync cable is constrained around the axial hub by at least one axially rotational printed circuit board.

16. The protective case assembly of claim 1, further comprising a recoil spring configured to rewind the spool assembly and thereby retract the charge/sync cable.

17. The protective case assembly of claim 14, wherein the rotary PCB contains apertures to accommodate within the thickness of the rotary PCB the deflection due to normal force of said electrical contact, thereby allowing surface-to-surface contact between the stationary PCB and the rotary PCB.

18. The protective case assembly of claim 14, wherein the integrated cable/connector assembly can be extended to any of a plurality of fixed distances from the protective case by manually pulling on the distal interface connector.

19. The protective case assembly of claim 14, wherein the integrated cable/connector assembly can be fully retracted into a protected and discreet position inside the protective housing assembly by manually rotating the spool top component.

20. A protective case assembly for a portable electronic device, comprising:
a protective housing assembly,
an integrated cable/connector assembly configured to be coupled to a standard portable electronic device charge/sync port of a portable electronic device, and
an integrated rotational spool assembly, containing a fixed length of charge/sync cable and a distal interface connector, that can be extended or retracted from the housing assembly,
wherein the protective housing assembly follows a profile of the portable electronic device, however deviates from the profile in a "bump-out" housing section of a minimum of 0.21 inches from a surface of a portable electronic device and a corresponding "bump-in" of the housing on said surface to create an easily discernible "nook" in the housing that allows a user to discern an orientation of the protective case assembly in one's pocket or in low light or visually obstructed conditions.

21. A protective case assembly for a portable electronic device, comprising:
   a protective housing assembly,
   an integrated cable/connector assembly configured to be coupled to a standard portable electronic device charge/sync port of a portable electronic device, and
   an integrated rotational spool assembly, containing a fixed length of charge/sync cable and a distal interface connector, that can be extended or retracted from the housing assembly,
   wherein the spool assembly includes a rotary PCB spring contact that maintains constant electrical contact between a rotary PCB of the spool assembly and a stationary PCB of the spool assembly as the rotary PCB rotates with respect to the stationary PCB.

22. A protective case assembly for a portable electronic device, comprising:
   a protective housing assembly,
   an integrated cable/connector assembly configured to be coupled to a standard portable electronic device charge/sync port of a portable electronic device, and
   an integrated rotational spool assembly, containing a fixed length of charge/sync cable and a distal interface connector, that can be extended or retracted from the housing assembly,
   wherein the spool assembly includes a spool top component having at least one finger depression configured to retain a user's finger during rotational spinning action of the spool assembly.

23. A protective case assembly for a portable electronic device, comprising:
   a protective housing assembly,
   an integrated cable/connector assembly configured to be coupled to a standard portable electronic device charge/sync port of a portable electronic device, and
   an integrated rotational spool assembly, containing a fixed length of charge/sync cable and a distal interface connector, that can be extended or retracted from the housing assembly,
   wherein an exterior of the protective case assembly extends at least 0.21 inches from a charge/sync port face of a portable electronic device to provide a thumb rest and gripping area for one handed viewing of a screen of the portable electronic device and unobstructed access to a user interface button of the portable electronic device while providing space inside the protective housing assembly for a proximal connector and a 180 degree bend of a proximal cable pigtail.

24. A protective case assembly for a portable electronic device, comprising:
   a protective housing assembly,
   an integrated cable/connector assembly configured to be coupled to a standard portable electronic device charge/sync port of a portable electronic device, and
   an integrated rotational spool assembly, containing a fixed length of charge/sync cable and a distal interface connector, that can be extended or retracted from the housing assembly,
   wherein the protective case assembly includes shallow pockets in which decals are disposed, the pocket depths and the thicknesses of the corresponding decals resulting in the decals protruding a distance above exterior surfaces of the protective housing assembly to provide at least one of anti-slip functionality and drop and bump protection.

* * * * *